United States Patent [19] [11] 3,748,645
Kawashima [45] July 24, 1973

[54] CHANNEL SELECTOR

[75] Inventor: Kazumi Kawashima, Settsu-shi, Japan

[73] Assignee: Matsushita Electric Industrial Co., Ltd., Kadoma-shi, Osaka, Japan

[22] Filed: July 21, 1972

[21] Appl. No.: 273,736

[30] Foreign Application Priority Data

July 23, 1971 Japan .............................. 46/55490
July 23, 1971 Japan .............................. 46/55491

[52] U.S. Cl. ............................ 340/168 R, 325/465
[51] Int. Cl. ........................................... H04b 1/26
[58] Field of Search ................................... 340/168; 178/DIG. 15; 325/464, 465, 459, 470; 334/8

[56] References Cited

UNITED STATES PATENTS 3,654,557 4/1972 Sakamoto et al. .................. 334/8 X

*Primary Examiner*—Donald J. Yusko
*Attorney*—Richard K. Stevens, Robert J. Frank et al.

[57] ABSTRACT

In a channel selector electronically operated a channel selecting signal from a key board or a remote control circuit is applied to a binary memory circuit, the content of the binary memory circuit is statically derived and used to cause a gate circuit to deliver an output corresponding to the content of the binary memory circuit, the output is then applied to a variable resistor which has a certain channel selecting voltage preset thereacross, and the channel selecting voltage is applied to the variable capacitance diode of an electronic tuner while a frequency band change-over voltage is derived from the multiplexer of a counter electrically associated with the binary memory circuit so as to change over channel selecting elements corresponding to the frequency bands to be selected, so that the perfectly electronic channel selection can be performed.

4 Claims, 1 Drawing Figure

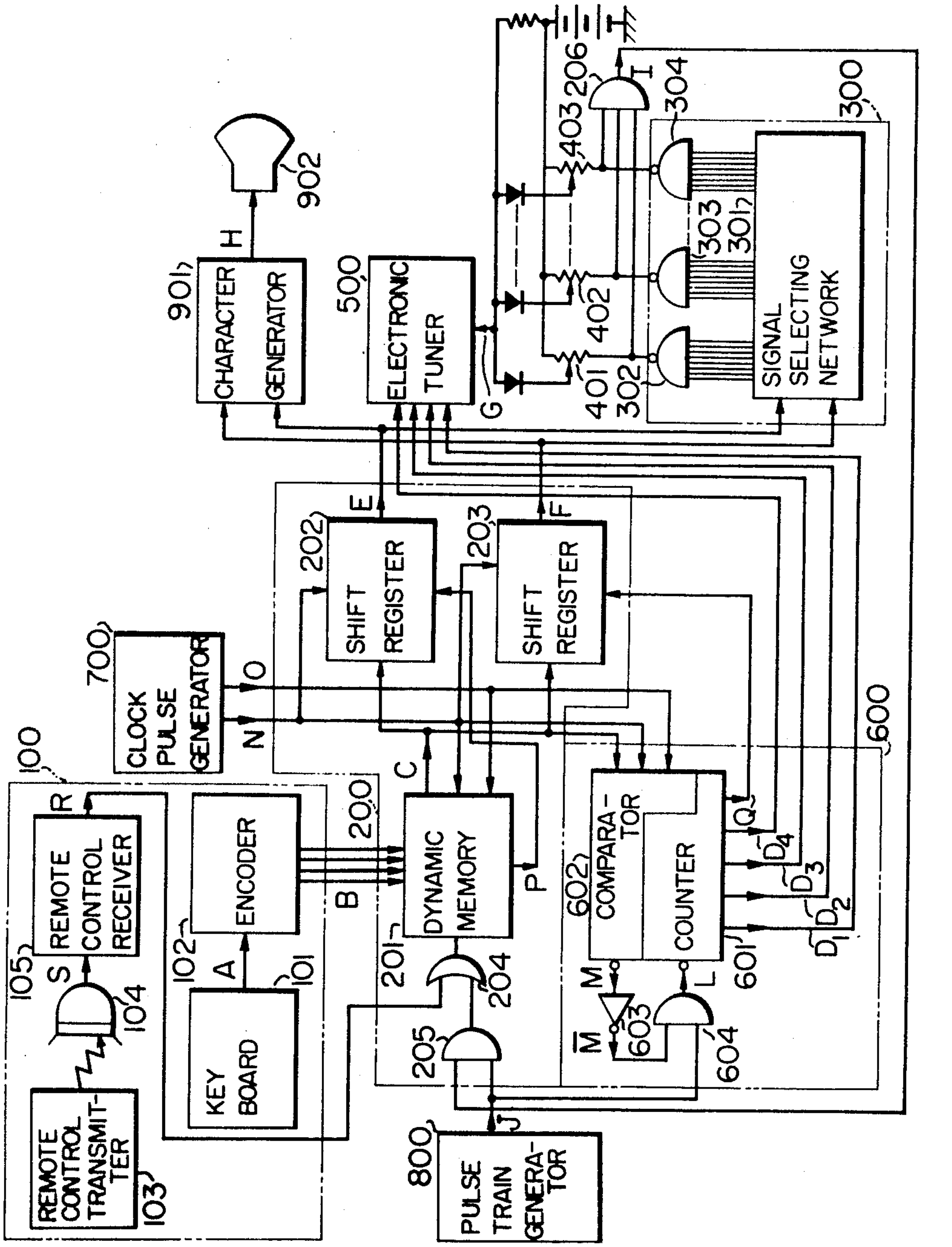
REMOTE CONTROL TRANSMIT-TER
REMOTE CONTROL RECEIVER
KEY BOARD
ENCODER
DYNAMIC MEMORY
CLOCK PULSE GENERATOR
SHIFT REGISTER
SHIFT REGISTER
COMPARA-TOR
COUNTER
PULSE TRAIN GENERA-TOR
CHARACTER GENERATOR
ELECTRONIC TUNER
SIGNAL SELECTING NETWORK
100
101
102
103
104
105
200
201
202
203
204
205
206
300
301
302
303
304
401
402
403
500
600
601
602
603
604
700
800
901
902
A
B
C
E
F
G
H
I
J
L
M
N
O
P
Q
R
S

CHANNEL SELECTOR

The present invention relates to a channel selector well adapted for use in a channel change-over device of a TV receiver.

The object of the present invention is to provide a channel selector which performs electronically its channel selecting operation by selecting, in response to the outputs of a binary memory circuit and a group of gate circuits, a plurality of variable resistors in which are preset channel selecting voltages to be applied to the variable capacitance diode of the electronic tuner for the purpose of channel selection, and by changing over the frequency bands of the electronic turner by the output of a counter associated electrically with the binary memory circuit so that the frequency bands of the tuner may coincide with those of channels required to be received.

Now, the present invention will be described by way of an embodiment and by the accompanying drawings, which shows in a block diagram a channel selector embodying the present invention.

In this figure reference numeral 100 designates a channel indicator which not only specifies the numbers of channels to be selected but also indicates that one channel now in selection is going to be changed over to another. The channel indicatOr 100 comprises a key board 101 by the actuation of which the channel numbers are specified, an encoder 102 which converts the decimal output signal A of the key board 101 into a four-bit binary signal B, a sensor element 104, such as a microphone for example, which delivers an electric signal S when it receives a signal in the form of electromagnetic wave, sound or light from a remote control transmitter 103, and a remote control receiver 105 which generates a pulse signal R by processing the electric signal S, Reference numeral 200 indicates a binary memory circuit which statically stores binary code signals derived from the key board 101 or other binary code signal representative of certain channels. The binary memory circuit 200 comprises a dynamic memory 201, such as a ring counter, which stores the signal B from the encoder 102, shift registers 202 and 203 which respectively read the first and second digits constituting a dynamic signal C stored in the dynamic memory 201 and convert the digit signals into respective binary codes E and F, an OR gate 204 which transmits the pulse signal R from the remote control receiver 105 to the dynamic memory 201 so as to increase the content of the dynamic memory by 'unity,' and an AND gate 205 which plays an important role in selecting only a desired channel. A gate circuit 300 comprises a signal selecting network 301 such as a diode matrix or a digital switch and a plurality of NAND gates 302, 303, ....., 304 each of which delivers an output in response to the corresponding one of the outputs of the signal selecting network 301. The NAND gates 302, 303, ....., 304 are kept at a low voltage while they are delivering outputs. When the NAND gates 302, 303, ..... , 304 deliver outputs, the corresponding variable resistors 401, 402, ..... , 403 draw currents selectively. Thus, the variable resistors 401, 402, ... , 403 are preset respectively with channel selecting voltages G to be applied to the variable capacitance diode of the electronic tuner 500 for the purpose of channel selection. A counter circuit 600 changes its content by following the content of the binary memory circuit 200 and delivers change-over signals $D_1$, $D_2$, $D_3$ and $D_4$ to change over the frequency bands of the electronic tuner 500 by changing over the tuning elements (for example, coils) of the tuner 500 according as the channels stored in the memory circuit correspond to a plurality of frequency bands, i.e., VHF low channel bands, VHF high channel bands or UHF channel bands. The counter circuit 600 comprises: a counter 601 with a multiplexer which has in itself a memory effect and delivers outputs $D_1$ and $D_3$ when its count content specifies chanels 1 to 3, signals $D_2$ and $D_3$ when the content indicates channel 4 to 12, and signal $D_4$ when the content corresponds to channels 13 to 62, i.e., UHF channels; a comparator which comprises the content of the counter 601 with that of the binary memory circuit 200 and delivers an output only when both the contents are coincident with each other; an inverter 603 which inverts the output $\overline{M}$ of the comparator 602 and delivers an output M; and an AND gate 604 which is opened by a pulse signal L to increase the content of the counter 601 by 'unity' when the content of the binary memory circuit 200 and the content of the counter are different from each other. A clock pulse generator 700 generates clock pulse signals N and O to operate the binary memory circuit 200 and the counter circuit 600 and a pulse train generator 800 generates a pulse train signal J which increase the content of the dynamic memory 201 as well as of the counter 601 by 'unity.' Discriminating pulse signals P and Q serve to read the first and second digits, respectively. An AND gate 206 delivers a channel selection stop signal I only when one of the NAND gates 302, 303, ....., 304 delivers an output, closes the AND gate 205, and prevent the content of the dynamic memory 201 from further increasing. Reference numeral 901 designates a character generator which generates a character signal H to perform channel indication according to the content of the binary memory circuit 200 and reference numeral 902 indicates a display device such as a picture tube, a Nixie tube or a digitron.

The operation of the above described constitution will now be described. When a particular channel, for example channel 7, is specified on the key board 101, signals corresponding to "0" and "7" are derived from the key board 101. Accordingly, a signal "07" is stored in the dynamic memory 201, a signal "0" in the shfit register 202, and a signal "7" in the shift resister 203. Then, the outputs of these shift registers 202 and 203 actuate only the NAND gate 303 for the channel 7, which delivers an output to cause current to flow through the variable resistor 402 so that the preset channel selecting voltage for the channel seven is applied to the variable capacitance diode of the electronic turner 500. If, at this time, the content of the counter 601 of the counter circuit 600 is not equal to "07," then the AND gate 604 is opened, the pulse signal J is applied to the counter 601 to shift the content 'unity' by 'unity,' and the counter stops when it has counted "07." Consequently, the output $D_2$ is delivered from the counter 601 and fed to the electronic tuner 500 select the tuning elements for the channels 4 to 12. Thus, the channel 7 is selected in the end. In the meanwhile, the AND gate 206 continues to deliver an output (since the NAND gate 303 delivers an output and is kept at a low voltage), so that the AND gate 205 is closed and the content of the binary memory circuit 200 is preserved.

Next, an explanation will be given of the case where a remote control signal is introduced. In this case, the remote control pulse signal R is produced by the remote control receiver 105 and fed through the OR gate 204 to the dynamic memory 201 so that the content of the memory 201 will increase by 'unity' and is equal to "08." If the NAND gates 302, 303, ..... , 304 are so set or designed as to deliver outputs respectively in accordance with channels 2, 7, 62 (namely, if they are so designed as to select only those channels), then none of the NAND gates 302, 303, ..... , 304 deliver outputs when the contents of the binary memory circuit 200 is "08." Accordingly, the AND gate 206 delivers an output, which opens the AND gate 205 so taht the pulse train signal J is supplied for the dynamic memory 201 to add to the content thereof by 'unity.' If this increased content of the dynamic memory 201 does not correspond to the desird channel, the above described operation will be repeated until the number of the desired channel has been stored in the memory 201 so that any one of the NAND gates 302, 303, ..... , 304 delivers an output. And when the content of the binary memory circuit 200 is increased up to the number corresponding to the channel 62, the NAND gate 304 delivers an output so that the channel selecting voltage for the channel 62 developed across the variable resistor 403 is applied to the variable capacitance diode of the elctronic tuner 500. Then, the AND gate 206 ceases to deliver an output and therefore the AND gate 205 is closed so that the content of the dynamic memory 201 is no more increased. Simultaneously, the counter circuit 600 also varies its content of counts following the content of the binary memory circuit 200 in the same way as described above and stops counting when the channel 62 has been counted, so that the output $D_4$ will be delivered and applied to the electronic tuner 500 to change over the frequency band of the tuner 500 to UHF band. This is all of how remote control channel selection is performed.

As described above, according to the present invention, the perfectly electronic channel selection can be performed so that an improved channel selection can be expected. Moreover, the channel selection operation can be facilitated and, in addition, the frequency bands of the electronic tuner can also be changed over. Further, the remote control channel selection can be effectively performed, too.

What is claimed is:

1. A channel selector comprising:
a binary memory circuit to statically store binary signals corresponding to channels to be selected;
a channel specifying circuit to specify the content of said binary memory circuit during channel selecting operation;
a group of gates to selectively deliver an output in accordance with the binary output of said binary memory circuit;
a plurality of variable resistors which are connected respectively with the output terminals of said group of gates and which have channel selecting voltages to be applied to the variable capacitance diode of an electronic tuner preset respectively thereacross; and
a counter circuit which changes its content following the content of said binary memory circuit and delivers change-over signals to change over the frequency bands of said electronic tuner according to the channels stored in said binary memory circuit belonging to a plurality of divided frequency bands.

2. A channel selector according to claim 1, wherein said counter circuit comprises a counter with a multiplexer which counts channel numbers in response to any pulse signal and selectively delivers an output according to any specific one of said plural bands to which some of said counted channel numbers, i.e., content of said counter, belong; a comparator which compares the content of said counter with that of said binary memory circuit; and a gate circuit which stops the counting operation of said counter when said comparator delivers a coincidence signal.

3. A channel selector according to claim 1, further comprising a channel selecting pulse generating circuit such as a remote control receiver which increases the content of said binary memory by 'unity' during channel selecting operation, a pulse generator which further increases the content of said binary memory circuit only when none of said group of gates deliver outputs, and a gate which prevents the pulse signal of said pulse generator from being fed to said binary memory circuit when any of said group of gates delivers an output.

4. A channel selector comprising:
a binary memory circuit which statically sotres binary signals corresponding to the channels to be selected;
a key board which sets any desired channel in said binary memory circuit during channel selecting operation;
a remote control receiver which increases the content of said binary memory circuit by 'unity' during remote control channel selecting operation;
a group of gates which as a whole selectively deliver an output in response to the binary outputs of said binary memory circuit;
a plurality of variable resistors which are connected respectively with the output terminals of said group of gates and which have channel selecting voltages to be applied to the variable capacitance diode of an electronic tuner preset respectively thereacross;
a combination of a gate and a pulse generator which sequentially increases the content of said binary memory circuit only when none of said group of gates deliver outputs;
a counter with a multiplexer which counts channel numbers in response to any pulse signal and selectively delivers an output according to any specific one of a plurality of frequency bands to which some of said counted channel numbers, i.e., content of said counter, belong;
a comparator which compares the content of said counter with that of said binary memory circuit; and
a gate circuit which stops the counting operation of said counter when said comparator delivers a coincidence signal.

* * * * *